United States Patent [19]
Pinter

[11] Patent Number: 5,322,816
[45] Date of Patent: Jun. 21, 1994

[54] METHOD FOR FORMING DEEP CONDUCTIVE FEEDTHROUGHS

[75] Inventor: Jerald F. Pinter, Carlsbad, Calif.

[73] Assignee: Hughes Aircraft Company, Los Angeles, Calif.

[21] Appl. No.: 6,215

[22] Filed: Jan. 19, 1993

[51] Int. Cl.$^5$ ............................................. H01L 21/48
[52] U.S. Cl. .................... 437/203; 437/915; 148/DIG. 135; 148/DIG. 164
[58] Field of Search ............... 437/203, 915, 919; 148/DIG. 135, DIG. 164

[56] References Cited
U.S. PATENT DOCUMENTS

| | | | |
|---|---|---|---|
| 4,596,069 | 6/1986 | Bayraktaroglu | 148/DIG. 135 |
| 4,765,864 | 8/1988 | Holland et al. | 437/203 |
| 4,954,458 | 9/1990 | Reid | 437/915 |
| 5,089,431 | 2/1992 | Slatter et al. | 437/203 |

*Primary Examiner*—Brian E. Hearn
*Assistant Examiner*—Laura M. Holtzman
*Attorney, Agent, or Firm*—W. C. Schubert; W. K. Denson-Low

[57] ABSTRACT

An interconnect layer (40) for interposing between two active circuit layers of a multi-chip module (50). The interconnect layer includes a layer of silicon (14) having first surface and second surfaces. A first layer of dielectric material (16) is disposed over the first surface and a second layer of dielectric material (12) disposed over the second surface. The interconnect layer includes at least one electrically conductive feedthrough (42) that is formed within an opening made through the layer of silicon. The opening has sidewalls (22) that are coated with a dielectric material (24) and an electrically conductive material for providing a topside contact (26). A second contact (28) is formed from the backside of the silicon layer after removing the substrate (10). In accordance with the invention, the sidewalls have a slope associated therewith such that an area of the opening is larger at the first surface of the silicon layer than at the second surface of the silicon layer, thereby improving the contact metal step coverage. The silicon layer is comprised of <100> silicon and has a thickness in the range of approximately 10 micrometers to approximately 50 micrometers. The opening is etched through the <100> silicon layer with KOH to provide an inwardly sloping sidewall profile having an angle that is approximately equal to 54.7 degrees.

5 Claims, 2 Drawing Sheets

METHOD FOR FORMING DEEP CONDUCTIVE FEEDTHROUGHS

FIELD OF THE INVENTION

This invention relates generally to integrated circuit fabrication techniques and, in particular, relates to fabrication techniques for three dimensional integrated circuit assemblies.

BACKGROUND OF THE INVENTION

In the fabrication of three dimensional integrated circuit assemblies, such as multi-chip modules, an interconnect layer is interposed between two layers of active circuitry to provide signal and power routing functions. As such, electrically conductive vias or feedthroughs are required to convey signal and power traces vertically between the two major surfaces of the interconnect layer.

For many applications, the interconnect layer is comprised of a relatively thin (approximately 10 micrometers to 50 micrometers) layer of silicon that is processed to form openings through the layer at locations where feedthroughs are required. During a subsequent metallization step, a suitable metal is deposited within the openings to provide an electrically conductive connection from one side of the layer of silicon to the other.

However, a problem is often encountered in obtaining a high quality, low resistance connection between the two surfaces. This problem is due in part to the conventional vertical-profile silicon trench etch process, such as a reactive ion etch, that is employed to form the feedthrough openings. The significant depth (typically in the range of 10-50 micrometers) through which the metallization must be deposited, in combination with the essentially vertical surfaces of the opening sidewalls, can result in variations in metal thickness and coverage within the openings. This leads to the formation of electrical connections that have less than optimum electrical resistance and reliability characteristics.

It is thus one object of this invention to provide a method for fabricating reliable, low resistance electrical feedthroughs within a semiconductor material.

It is a further object of this invention to provide a method for fabricating an electrical interconnect layer that is suitable for use in a multi-chip module, the electrical interconnect layer including low resistance and highly reliable feedthroughs.

It is one further object of this invention to provide a silicon electrical interconnect layer wherein feedthroughs have inwardly tapering sidewalls for improving the contact metal step coverage.

SUMMARY OF THE INVENTION

The foregoing and other problems are overcome and the objects of the invention are realized by an interconnect layer, and by a method for fabricating same, that transfers electrical signals and power between vertical layers of three dimensional integrated circuits. An important feature of the electrical interconnect layer is the feedthroughs that route signal lines and power from one side of the interconnect layer to the other. The feedthroughs that are fabricated in accordance with this invention have a number of advantages, including the following.

First, the method employs existing standard wafer fabrication processes, thus making it feasible for high volume manufacturing.

Second, the feedthrough provides a low resistance path for signal or power between active circuit layers while incorporating standard metallization.

Third, the feedthrough provides excellent electrical isolation by incorporating thermally grown or deposited silicon dioxide for an insulator material.

Fourth, the uniformly sloped profile provides excellent metal step coverage for high conduction and reliability, even within deep (50 micrometer) feedthroughs.

Fifth, the dimensional control attained by the method enables the feedthrough to be used for backside wafer photolithographic alignment targets.

In accordance with this invention there is provided an interconnect layer for interposing between two active circuit layers. The interconnect layer includes a layer of silicon having a first surface and a second surface that is opposite the first surface. A first layer of dielectric material is disposed over the first surface and a second layer of dielectric material disposed over the second surface. The interconnect layer includes at least one electrically conductive feedthrough that is formed within an opening through the layer of silicon. The opening has sidewalls that are coated with a dielectric material and an electrically conductive material that forms a topside contact. A second contact is formed from the backside of the silicon layer after removing the substrate.

In accordance with the invention the sidewalls have a slope associated therewith such that an area of the opening is larger at the first surface of the silicon layer than at the second surface of the silicon layer, thereby improving the contact metal step coverage.

In a presently preferred embodiment of the invention the silicon layer is comprised of <100> silicon and has a thickness in the range of approximately 10 micrometers to approximately 50 micrometers. The opening is etched through the <100> silicon layer with KOH to provide an inwardly sloping sidewall profile having an angle that is approximately equal to 54.7 degrees. The first and second dielectric layers and the dielectric coating material are all comprised of silicon dioxide.

The silicon layer is obtained from a bonded silicon structure that includes a substrate, a layer of bonding oxide, and the silicon layer. After topside processing of the silicon layer is completed, the substrate is removed to enable the bottomside processing of the silicon layer to occur.

BRIEF DESCRIPTION OF THE DRAWINGS

The above set forth and other features of the invention are made more apparent in the ensuing Detailed Description of the Invention, which is intended to be read in conjunction with the attached Drawings, wherein.

DETAILED DESCRIPTION OF THE INVENTION

Figure 1A:
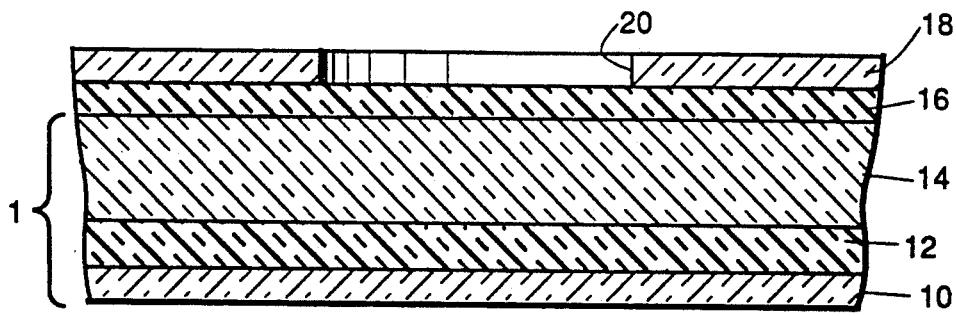
FIGS. 1a-1d are each a cross-sectional view, not to scale, of an interconnect layer that illustrates a method in accordance with this invention.

A presently preferred method for fabricating an electrical interconnect layer, and specifically the feedthroughs thereof, is now described with respect to FIGS. 1a–1d. Processing begins with a bonded silicon structure 1 that includes a silicon substrate 10, a layer of bonding oxide 12, and an overlying silicon <100> film layer 14. By example, the silicon substrate 10 has a thickness of approximately 500 micrometers, the SiO2 dielectric layer 12 a thickness of approximately 10,000 Angstroms, and the silicon film layer 14 has a thickness within a range of approximately 10 micrometers to approximately 50 micrometers. Bonded silicon structures having these characteristics are commercially available, or may be fabricated using known techniques.

It is noted that the teaching of this invention is not limited for use only with silicon layers having a thickness within the range of approximately 10 micrometers to approximately 50 micrometers. This particular thickness range is exemplary, and is employed herein because the resultant interconnect layer exhibits required physical strength and rigidity characteristics when fabricated to have a thickness within this range. However, a semiconductor material layer having a thickness outside of this range may also benefit from the teaching of this invention. In general, the teaching of this invention provides advantages for a semiconductor layer that has a thickness that can result in less than optimum metal coverage when a conventional vertical profile aperture etch process is employed. By example, a semiconductor layer having a thickness of approximately one micrometer can benefit from the teaching of this invention.

In the example described below, the thickness of the silicon film layer 14 is approximately 25 micrometers.

A first step grows a 3000 Angstrom thick thermal silicon dioxide layer 16 upon the silicon film layer 14. A 1000 C steam process is a suitable method for growing the thermal silicon dioxide layer 16.

A second step deposits a layer of photoresist 18 and patterns same using a feedthrough mask. The feedthrough mask is patterned so as to form an aperture 20 at a location where a feedthrough is desired. The diameter of the aperture 20 is preferably greater than approximately twice the thickness of the silicon film layer 14. This relationship between the diameter of the aperture 20 and the thickness of the film layer 14 results from the inwardly sloped sidewalls of the subsequently etched opening through the film layer 14, and has been found to provide a correct diameter for the bottom of the etched opening.

FIG. 1a is a cross-sectional view that illustrates the structure after forming the aperture 20 within the photoresist layer 18.

Next, the 3000 angstrom thick SiO2 layer 16 is etched through the aperture 20 by either a Buffered Oxide Etch (BOE) or by dry plasma etching. This exposes the upper surface of the underlying silicon film layer 14 within the area of the aperture 20. The photoresist layer 18 is then stripped away by a standard stripping process.

A next step performs a KOH etch of the silicon film layer 14 through the opening that was etched through the oxide layer 16. The vertical etch rate of silicon has been measured to be 4000 Angstroms/minute, while that of SiO2 was found to be only 8.5 Angstroms/minute. This significant variation in etch rates provides a very high selectivity (470:1) for silicon. The KOH also has the property of etching preferentially along the silicon crystal such that a 54.7 degree sidewall 22 slope is obtained when etching <100> silicon. The 10,000 Angstrom bonding oxide layer 12 provides a high selectivity "etch-stop" and results in a high level of process latitude.

Figure 1B:
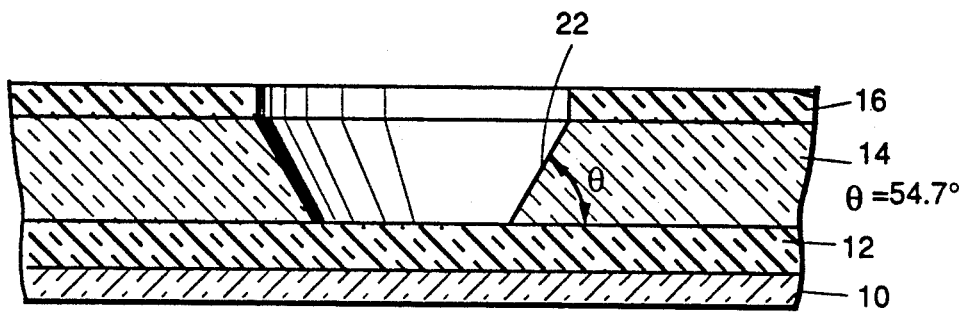

FIG. 1b is a cross-sectional view that illustrates the structure after etching the silicon film layer 14. As can be seen, due to the sloped sidewalls 22 the etched opening is larger at the top surface of the silicon layer 14 than at the bottom of the silicon layer that is adjacent to the SiO2 layer 12.

A next step grows a 3000 Angstrom thermal silicon dioxide trench isolation layer 24 upon the sloping sidewalls 22. The specific thickness of the dielectric layer 2 is selected to meet the circuit requirements. A deposited oxide grown by LPCVD or PECVD may also be incorporated.

Conductor metallization is then blanket deposited. By example, a standard sputtered 7500 Angstrom aluminum-silicon-copper film is formed, although the specific metallization system may be selected to meet the specific circuit requirements. Next, the conductor metallization is patterned using standard photolithography techniques and a conventional wet or dry metal etching process. This results in the formation of a metal contact 26 upon the sloping sidewalls 22 and the overlying oxide dielectric layers 24 and 16. The specific metallization pattern is circuit dependent. During this step any required conductive traces are also patterned and formed over the silicon dioxide layer 16.

Figure 1C:
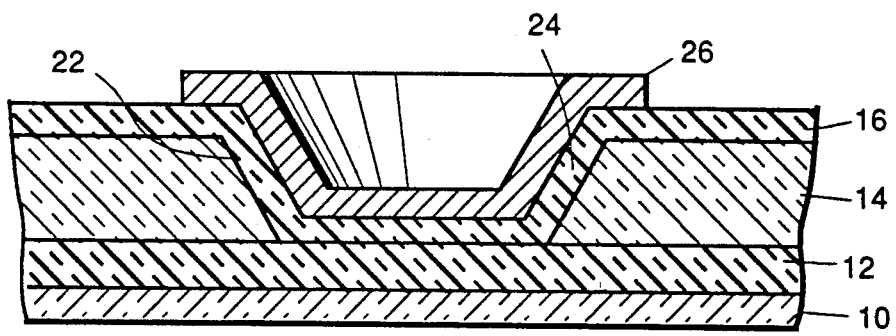
Figure 1D:
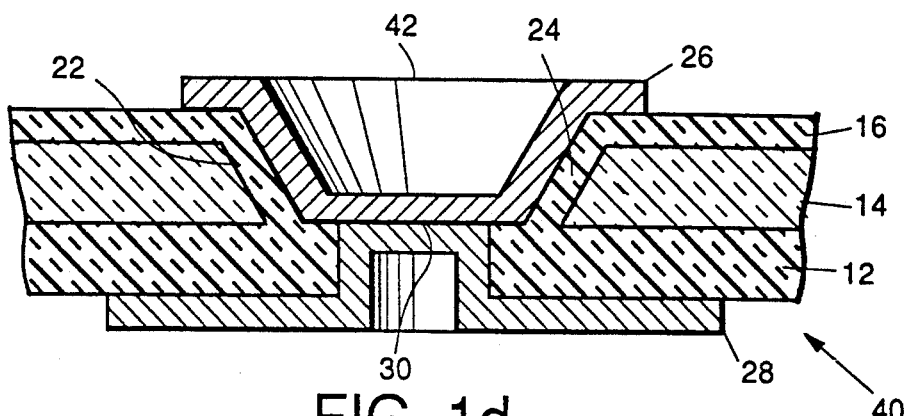

FIG. 1c is a cross-sectional view that illustrates the structure after patterning and etching the metallization layer and forming the topside metal contact 26.

Using a transfer-thinning process, the 10,000 Angstrom bonding oxide layer 12 is exposed from the backside by first mounting the topside surface to a carrier wafer (such as sapphire) and then removing the silicon substrate 10 of the bonded silicon structure 1 with a KOH etch. The carrier wafer is not shown in the Figures.

Next, using photolithography alignment targets defined by the conductor-filled feedthroughs, the exposed 10,000 Angstrom bonding oxide layer 12 is patterned and opened using a standard "Pad etch" or "Via etch" (wet or dry process) which etches through the bonding oxide layer 12, but which does not etch the already deposited metal of the contact 26. Backside metal is then deposited and patterned using standard fabrication processes, thus forming a backside contact 28 that is electrically coupled to the topside contact 26 along a metal-metal interface region 30. This completes the connection from one side of the silicon layer 14 to the other, and results in the formation o f the interconnect layer 40 (FIG. 1d) having deep feedthroughs 42 defined by the topside metal contact 26, having sloping sidewalls, and the adjacent backside metal contact 28. Silicon dioxide dielectric layers 12, 16 and 24 provide electrical isolation between the conductive material of the feedthrough 42 and the silicon layer 14.

The method described above was performed on several wafers having varying bonded silicon film thicknesses in the range of 10 micrometers to 50 micrometers. The feedthroughs 42 were evaluated using cross-sections and Scanning Electron Microscopy (SEM). SEM results verified excellent metallization step coverage, with no visible thinning occurring within the feedthrough 42. A wafer was then backside thinned as explained above. The alignment targets defined by the feedthroughs were successfully verified with a Canon MPA-600 photolithography system.

The feedthroughs 42 that are fabricated in accordance with this invention exhibit a number of advantages over conventionally formed feedthroughs, including the following.

First, the method employs existing standard wafer fabrication processes, thus making it feasible for high volume manufacturing.

Second, the feedthrough 42 provides a low resistance path for signal or power between active layers while incorporating standard metallization.

Third, the feedthrough 42 provides excellent electrical isolation by incorporating the thermally grown or deposited silicon dioxide layers as an insulator material.

Fourth, the uniformly sloped profile provides excellent metal step coverage for high conduction and reliability, even within deep (50 micrometer) feedthroughs.

Fifth, the dimensional control attained by the method enables the feedthrough 42 to be used as a backside wafer photolithographic alignment target.

Figure 2:
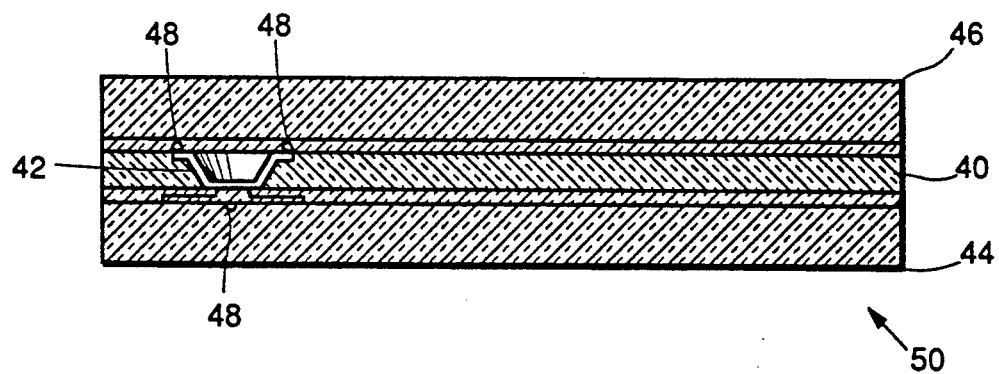
FIG. 2 is cross-sectional view, not to scale, that illustrates the interconnect layer interposed between two active circuit layers.

FIG. 2 is a cross-sectional view of a multi-chip module 50 and illustrates the interconnect layer 40 interposed between a first active circuit layer 44 and a second active circuit layer 46. In practice, more than two active circuit layers may employed, with an appropriate number of interposed interconnect layers 40. Although only one feedthrough 42 is illustrated, it should be realized that a large number of the feedthroughs are formed for providing vertical interconnects between the active circuit layers 44 and 46. The module 50 is fabricated by hybridization techniques and may employ indium bump contacts 48 for electrically coupling the active circuit layers to the feedthrough 42. The use of a silicon layer 14 of up to 50 micrometers in thickness provides the required rigidity and also enables the interconnect layer 40 to withstand the forces that are typically applied during hybridization.

While the invention has been particularly shown and described with respect to a preferred embodiment thereof, it will be understood by those skilled in the art that changes in form and details may be made therein without departing from the scope and spirit of the invention.

What is claimed is:

1. A method of forming an electrically conductive feedthrough within a semiconductor layer, comprising the steps of:

providing a multilayered structure that includes a substrate, a layer of dielectric material having a first surface that overlies a surface of the substrate and a second surface that is opposite to the first surface, and a semiconductor layer having a first surface that overlies the second surface of the layer of dielectric material and a second surface that is opposite the first surface of the semiconductor layer;

forming at least one opening through the semiconductor layer to expose an underlying portion of the second surface of the dielectric layer, the opening having sidewalls that are coated with a dielectric material, the sidewalls having a slope associated therewith such that an area of the opening is larger at the second surface of the semiconductor layer than at the first surface of the semiconductor layer;

depositing an electrically conductive material upon the tapered sidewalls and upon the exposed portion of the second surface of the dielectric layer;

removing the substrate to expose the first surface of the dielectric layer;

forming an opening through the dielectric layer, the opening being formed in registration with the opening through the semiconductor layer and exposing a portion of the electrically conductive material that was deposited upon the portion of the second surface of the dielectric layer; and depositing an electrically conductive material within the opening formed through the dielectric layer such that the electrically conductive material that was deposited within the opening through the semiconductor layer is electrically coupled to the electrically conductive material that is within the opening through the dielectric layer.

2. A method as set forth in claim 1 wherein the semiconductor layer is comprised of <100> silicon, and wherein the step of forming at least one opening through the semiconductor layer includes a step of etching the <100> silicon with KOH.

3. A method as set forth in claim 1 wherein the step of forming at least one opening through the semiconductor layer includes the initial steps of:

forming a dielectric layer upon the second surface of the semiconductor layer; and opening an aperture through the dielectric layer, the aperture having an area that is a function of the thickness of the semiconductor layer.

4. A method as set forth in claim 1 wherein the semiconductor layer is comprised of <100> silicon that has a thickness in the range of approximately 10 micrometers to approximately 50 micrometers, and wherein the step of forming at least one opening through the semiconductor layer includes the steps of:

forming an oxide layer upon the second surface of the <100> silicon layer;

opening an aperture through the oxide layer, the aperture having a diameter that is at least approximately twice the thickness of the <100> silicon layer; and etching the <100> silicon with KOH through the aperture.

5. A method as set forth in claim 2 wherein the slope is approximately equal to 54.7 degrees.

* * * * *